(12) United States Patent
Cha et al.

(10) Patent No.: US 6,284,610 B1
(45) Date of Patent: Sep. 4, 2001

(54) METHOD TO REDUCE COMPRESSIVE STRESS IN THE SILICON SUBSTRATE DURING SILICIDATION

(75) Inventors: Randall Cher Liang Cha; Chee Tee Chua; Kin Leong Pey, all of Singapore (SG); Lap Chan, San Francisco, CA (US)

(73) Assignees: Chartered Semiconductor Manufacturing Ltd.; National University of Singapore, both of Singapore (SG)

( * ) Notice: Subject to any disclaimer, the term of this patent is extended or adjusted under 35 U.S.C. 154(b) by 0 days.

(21) Appl. No.: 09/666,315

(22) Filed: Sep. 21, 2000

(51) Int. Cl.[7] .................................................. H01L 21/336
(52) U.S. Cl. ......................... 438/300; 438/592; 438/301; 438/303
(58) Field of Search ................... 438/299–307, 438/592

(56) References Cited

U.S. PATENT DOCUMENTS

| 5,683,924 | 11/1997 | Chan et al. | 437/44 |
|---|---|---|---|
| 5,879,997 | 3/1999 | Lee et al. | 438/300 |
| 6,001,697 | 12/1999 | Chang et al. | 438/299 |
| 6,004,879 | 12/1999 | Hu et al. | 438/682 |
| 6,177,314 | * 1/2001 | van der Meer et al. | 438/527 |
| 6,215,152 | * 4/2001 | Hebert | 257/340 |

FOREIGN PATENT DOCUMENTS

| 7201777 | * 8/1995 | (JP) | H01L/21/28 |
|---|---|---|---|
| 10125623 | * 5/1998 | (JP) | H01L/21/28 |

* cited by examiner

Primary Examiner—Charles Bowers
Assistant Examiner—Thanh Nguyen
(74) Attorney, Agent, or Firm—George O. Saile; Rosemary L. S. Pike

(57) ABSTRACT

A method for siliciding source/drain junctions is described wherein compressive stress of the underlying silicon is avoided by the insertion of a buffer layer between the silicide and the silicon. A gate electrode and associated source/drain extensions are provided in and on a semiconductor substrate. A buffer oxide layer is deposited overlying the semiconductor substrate and the gate electrode. A polysilicon layer is deposited overlying the buffer oxide layer. The polysilicon layer will form the source/drain junctions and silicon source. The source/drain junctions are silicided whereby the buffer oxide layer provides compressive stress relief during the siliciding.

31 Claims, 5 Drawing Sheets

METHOD TO REDUCE COMPRESSIVE STRESS IN THE SILICON SUBSTRATE DURING SILICIDATION

BACKGROUND OF THE INVENTION (1) Field of the Invention

The invention relates to the fabrication of integrated circuit devices, and more particularly, to a method of silicidation wherein silicon stress is reduced in the fabrication of integrated circuits.

(2) Description of the Prior Art

Many benefits derive from silicided polysilicon gates and source/drain junctions. Nevertheless, recent investigations indicate that abnormal compressive stresses can be generated within the silicon substrate at the source/drain regions, especially near the shallow trench isolation (STI) corner or beneath the spacers during silicidation. These deleterious compressive stresses readily create defects at or in the vicinity of the interface between silicide and silicon. These defects have been diagnosed as the main culprit for high leakage current in the case of titanium silicidation. In addition, the compressive stresses induce the generation of high tensile stress within proximity regions, e.g. beneath the gate. The level of the tensile stress increases with the shrinking of gate length. Hence, the concomitant compressive stresses from source/drain silicidation have to be remedied effectively as well as efficiently.

FIG. 1 illustrates a portion of a partially completed integrated circuit. The semiconductor substrate 10 is preferably composed of silicon having a (100) crystallographic orientation. Gate electrode 16 and source/drain region 20 are formed in and on the semiconductor substrate as is conventional in the art. The source/drain junction has been silicided 22. The circles 23 indicate defects; leakage paths beneath the spacers and around the shallow trench isolation (STI). These are localized stress junctions. Stress junctions occur in regions where compressive stress from silicidation at the source/drain junction meets tensile stress at the spacer and the STI.

U.S. Pat. No. 5,683 924 to Chan et al teaches formation of a silicide film over epitaxial silicon or polysilicon raised source/drain regions. U.S. Pat. No. 6,001,697 to Chang et al discloses poly plugs over the source/drain junctions where silicidation is performed over the poly plugs. U.S. Pat. No. 5,879,997 to Lee et al discloses a polysilicon layer over the source/drain regions. The polysilicon is oxidized. Silicidation is not disclosed. U.S. Pat. No. 6,004,879 to Hu et al teaches a CoSixO contact material. None of the patents discuss stress relief during silicidation.

SUMMARY OF THE INVENTION

A principal object of the present invention is to provide an effective and very manufacturable method of siliciding gates and source/drain junctions in the fabrication of an integrated circuit.

A further object of the invention is to provide a method of siliciding source/drain junctions wherein compressive stress generated beneath the silicided source/drain junctions is reduced.

Yet another object is to provide a method of siliciding source/drain junctions wherein compressive stress of the underlying silicon is avoided by the insertion of a buffer layer between the silicide and the silicon.

Yet another object is to provide a method of siliciding source/drain junctions wherein compressive stress of the underlying silicon is avoided by the insertion of an oxide buffer layer between the silicide and the silicon.

In accordance with the objects of the invention a method for siliciding source/drain junctions is achieved wherein compressive stress of the underlying silicon is avoided by the insertion of a buffer layer between the silicide and the silicon. A gate electrode and associated source/drain extensions are provided in and on a semiconductor substrate. A buffer oxide layer is deposited overlying the semiconductor substrate and the gate electrode. A polysilicon layer is deposited overlying the buffer oxide layer. The polysilicon layer will form the source/drain junctions and silicon source. The source/drain junctions are silicided whereby the buffer oxide layer provides compressive stress relief during the siliciding.

Also in accordance with the objects of the invention, a method for siliciding source/drain junctions is achieved wherein compressive stress of the underlying silicon is avoided by the insertion of a buffer layer between the silicide and the silicon. A polysilicon gate electrode and associated source/drain junctions are provided in and on a semiconductor substrate. A first nitride layer overlies a top surface of the polysilicon gate electrode. A thermal oxidation forms oxide sidewalls on the polysilicon gate electrode and a first oxide layer over the substrate. A buffer oxide layer is deposited overlying first oxide layer on the semiconductor substrate and the gate electrode. A polysilicon layer is deposited overlying the buffer oxide layer. A second nitride layer is deposited overlying the polysilicon layer. The nitride layer is polished back until the buffer oxide layer overlying the gate electrode is exposed whereby a vertical portion of the polysilicon layer is exposed adjacent to the buffer oxide layer forming a vertical sidewall on the gate electrode. The exposed polysilicon layer is etched away thereby exposing a portion of the buffer oxide layer overlying the source/drain junction. The exposed buffer oxide layer overlying the semiconductor substrate and overlying the gate electrode are etched away thereby exposing a portion of the semiconductor substrate and exposing the first nitride layer of the gate electrode. Thereafter an epitaxial-silicon layer is grown overlying the exposed semiconductor substrate. The first and second nitride layers are removed. The gate electrode and source/drain junctions are silicided whereby the buffer oxide layer provides compressive stress relief during siliciding to complete siliciding of the source/drain junctions in the fabrication of an integrated circuit device.

BRIEF DESCRIPTION OF THE DRAWINGS

In the accompanying drawings forming a material part of this description, there is shown.

DESCRIPTION OF THE PREFERRED EMBODIMENTS

The present invention seeks to eradicate the generation of compressive stress beneath a silicided source/drain junction via the insertion of an oxide buffer layer between the silicide and the silicon substrate. The bulk of the generated stress incurred during silicidation will be absorbed by the oxide buffer layer and not pass onto the substrate. As a consequence, since the concentration of defects has been reduced, we should anticipate lower leakage current.

The process of the present invention will be described with reference to FIGS. 2–10 which depict a gate electrode and associated source/drain junctions to be silicided. It will be understood by those skilled in the art that the process of the present invention should not be limited to the application disclosed in the figures, but can be applied in any application in which silicidation is to occur over a silicon substrate.

Figure 1:
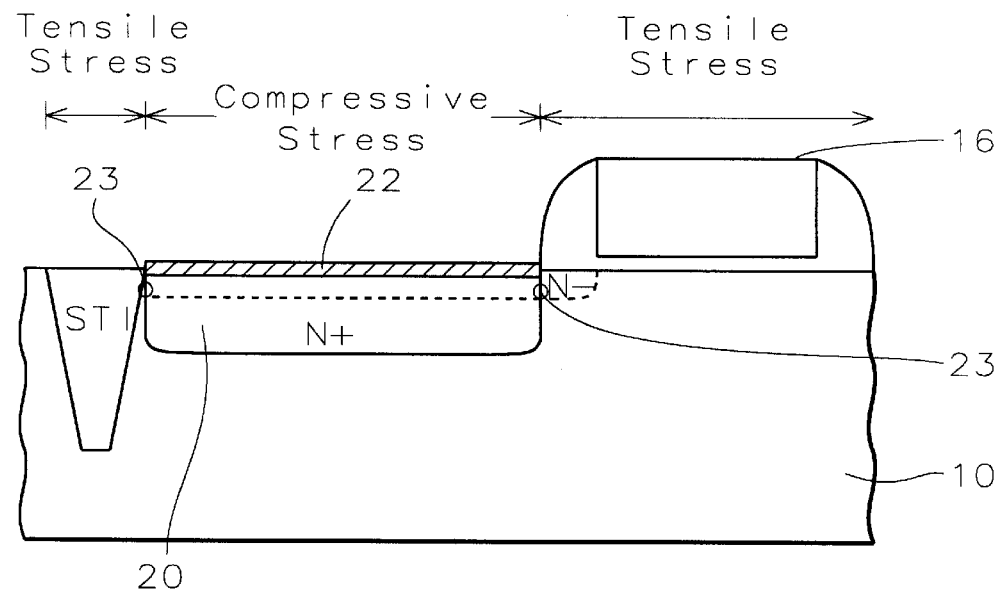
FIG. 1 schematically illustrates in cross-sectional representation an integrated circuit device of the prior art.
Figure 2:
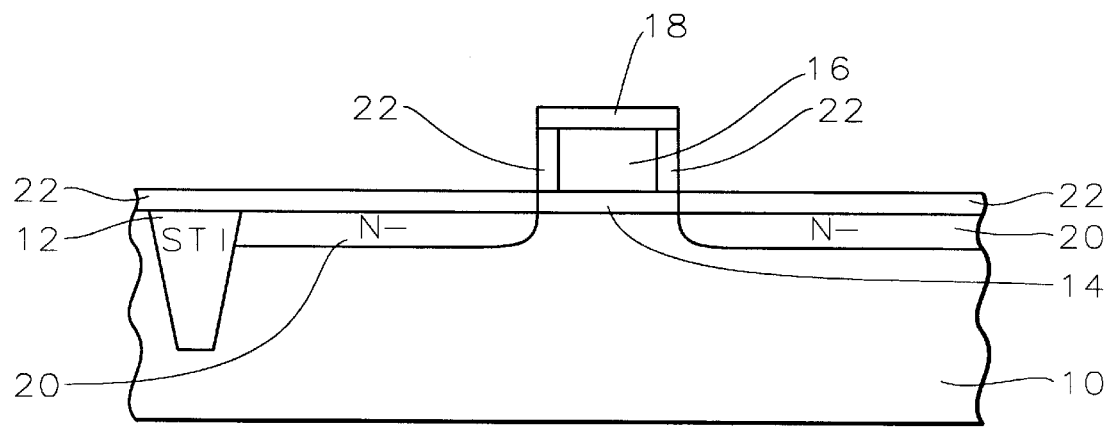
FIGS. 2 through 10 schematically illustrate in cross-sectional representation a preferred embodiment of the present invention.

Referring now more particularly to FIG. 2, there is shown an illustration of a portion of a partially completed integrated circuit. The semiconductor substrate 10 is preferably composed of silicon having a (100) crystallographic orientation. Isolation regions such as STI region 12 are formed within the semiconductor substrate. A gate oxide layer 14 is grown, followed by deposition of a polysilicon layer 16 and an overlying nitride layer 18. These layers are patterned to form the gate electrode shown in FIG. 2.

Source and drain regions may n-type or p-type, depending on the type of device to be fabricated. N-type regions will be illustrated in the figures. Ions are implanted to form the n-regions 20, as shown. These are the source/drain extensions. A thermal oxidation is performed to activate the source/drain extensions 20 whereby the polysilicon is oxidized 22. The silicon substrate in the area of the source/drain extensions 20 is oxidized as well as the sidewalls of the gate 16. The oxidation 22 of the gate sidewalls decreases the width of the gate, thus allowing for smaller gate sizing. The thermal oxidation both activates the source/drain extensions 20 and reduces the polysilicon gate size by the thickness of the oxidized sidewalls 22. In this way, higher source/drain dopant concentrations and smaller gate length are achieved.

Figure 3:
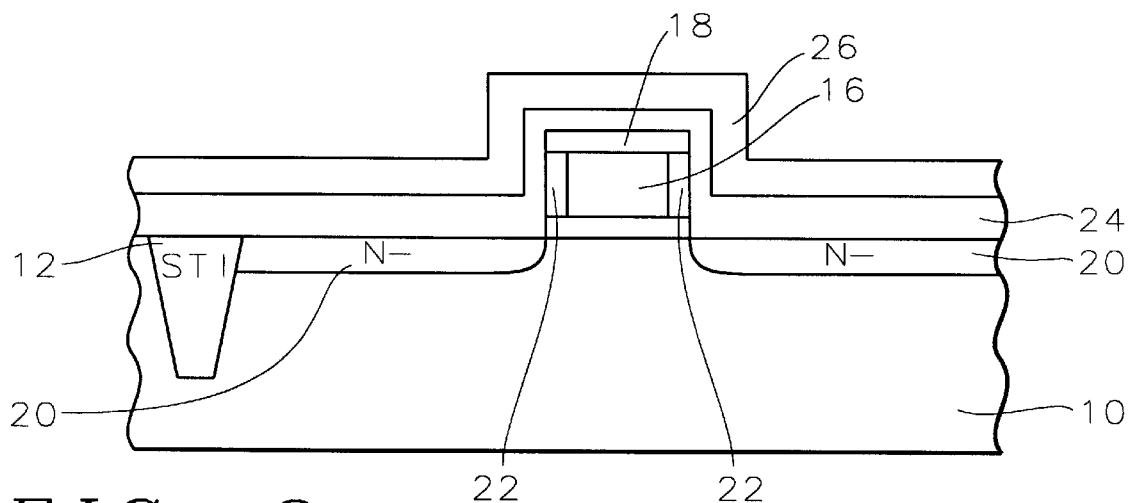

Referring now to FIG. 3, a liner oxide layer 24 is deposited over the silicon substrate and overlying the gate electrode. This liner oxide layer has a thickness of between about 500 and 800 Angstroms. The horizontal thermal oxide 22 over the source/drain extensions has been incorporated into the liner oxide layer 24. The deposited liner oxide 24 and the oxidized polysilicon gate sidewalls 22 act as vertical spacers separating the gate 16 and the source/drain extensions 20. The liner oxide layer will provide stress relief for the underlying silicon substrate during silicidation.

Now, a polysilicon layer 26 is conformally deposited overlying the liner oxide layer to a thickness of between about 600 and 800 Angstroms. The polysilicon layer 26 is doped by ion implantation or in-situ doped. This polysilicon layer will form raised source/drain regions. Also, this polysilicon layer provide s material for silicidation so that the substrate silicon is not consumed thereby implying lower leakage to the substrate.

Figure 4:
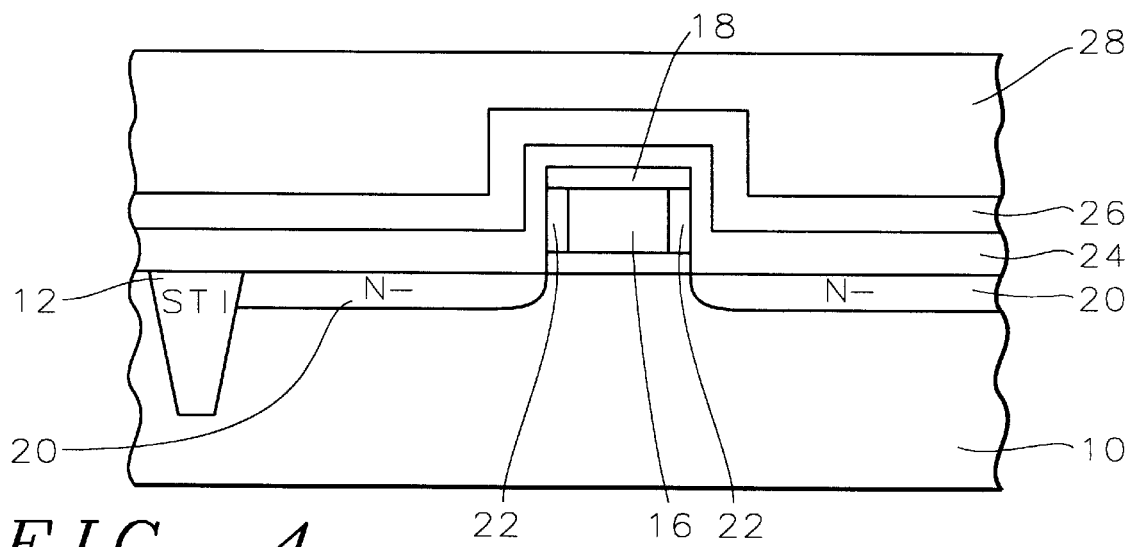
Figure 5:
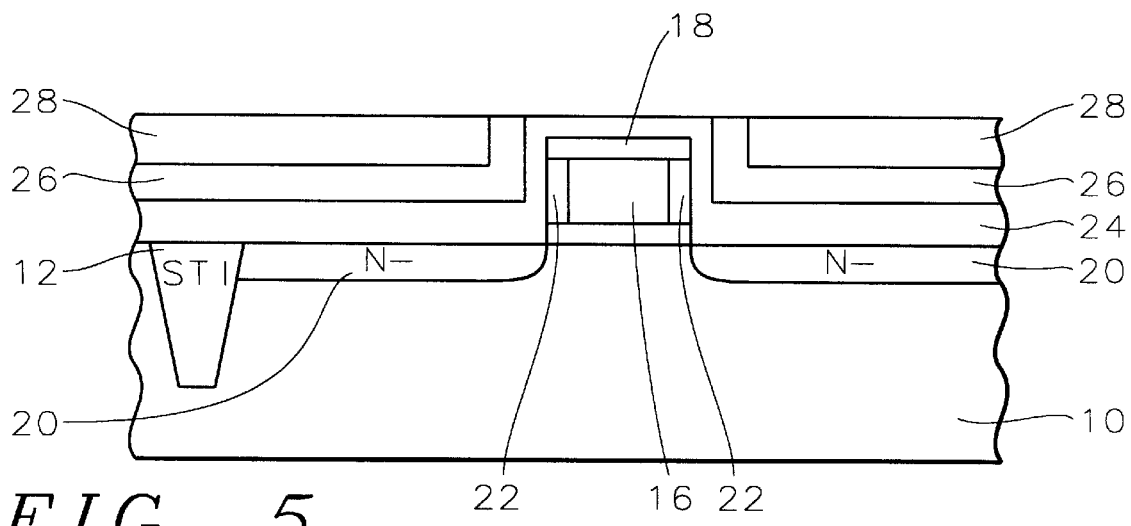
Figure 6:
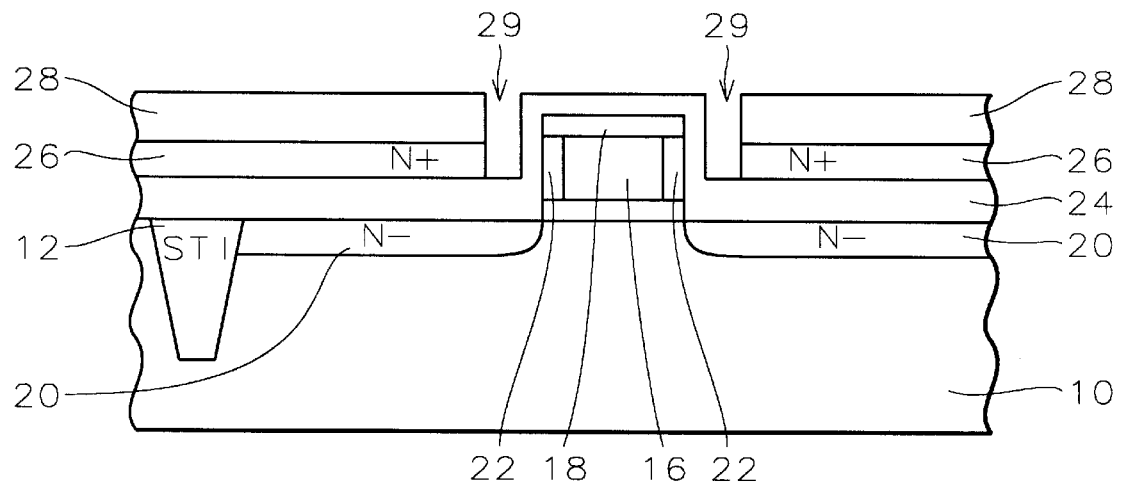

Referring now to FIG. 4, a second nitride layer 28 is deposited over the polysilicon layer 26 to a thickness of between about 2500 and 3500 Angstroms. Now, the nitride layer 28 and the top polysilicon layer 26 are polished by chemical mechanical polishing (CMP). This is a timed polishing step to stop at the oxide layer 24, as shown in FIG. 5. The polysilicon layer 26 is exposed at the edges of the gate electrode.

Now, the exposed polysilicon 26 is etched away where it is not covered by the nitride layer 28. This is a self-aligned etch. No mask is necessary because the etchant species are chosen to be selective to polysilicon with respect to oxide and nitride. The polysilicon is etched away a s shown by 29 in FIG. 6.

Figure 7:
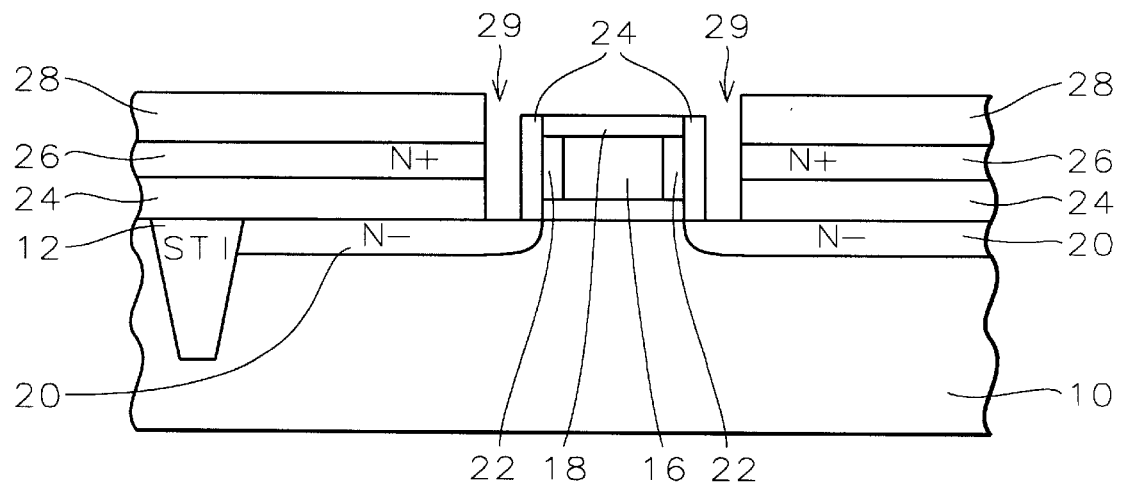

A s shown in FIG. 7, another self-aligned etch removes the oxide layer 24 exposed within the openings 29 and removes the oxide layer 24 on the top surface of the gate electrode. The silicon substrate is exposed within these openings.

The polysilicon regions 26 overlying the oxide liner layer 24 form source/drain regions.

Figure 8:
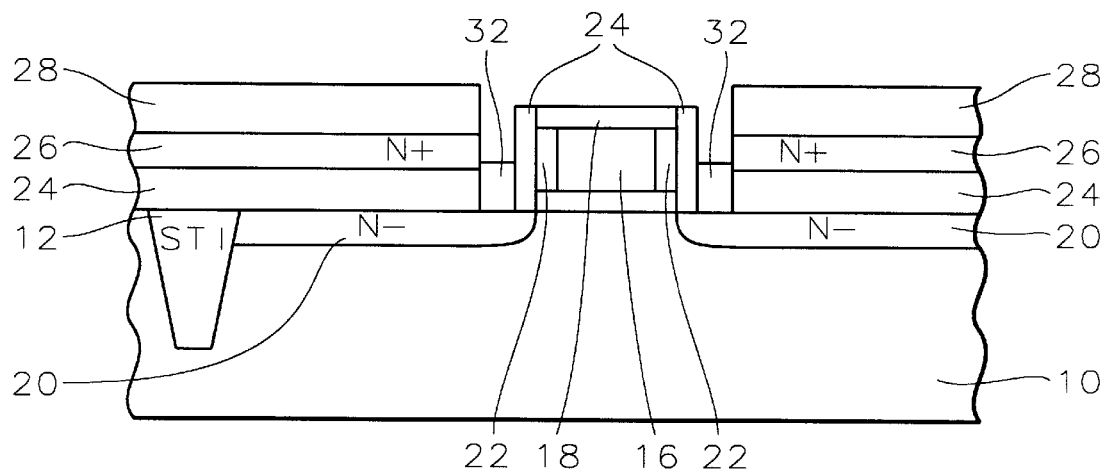

Referring now to FIG. 8, a controlled self-aligned epitaxial silicon growth is performed. Epi-silicon 32 grows where the silicon substrate is exposed near the edges of the gate electrode. The epi-silicon 32 is grown to a thickness of between about 200 and 500 Angstroms. The epi-silicon 32 makes a connection or a bridge for the silicided raised source/drain 26 resting on the oxide buffer layer 24. The bridge also allows the electron current crowding effect to be reduced.

During epi-silicon growth, any exposed silicon or polysilicon can grow in size. The silicon should grow only at the exposed active substrate 29. All other regions of the silicon substrate and the polysilicon layers are covered either by nitride blocks 28 or by oxide liner sidewalls 24.

Figure 9:
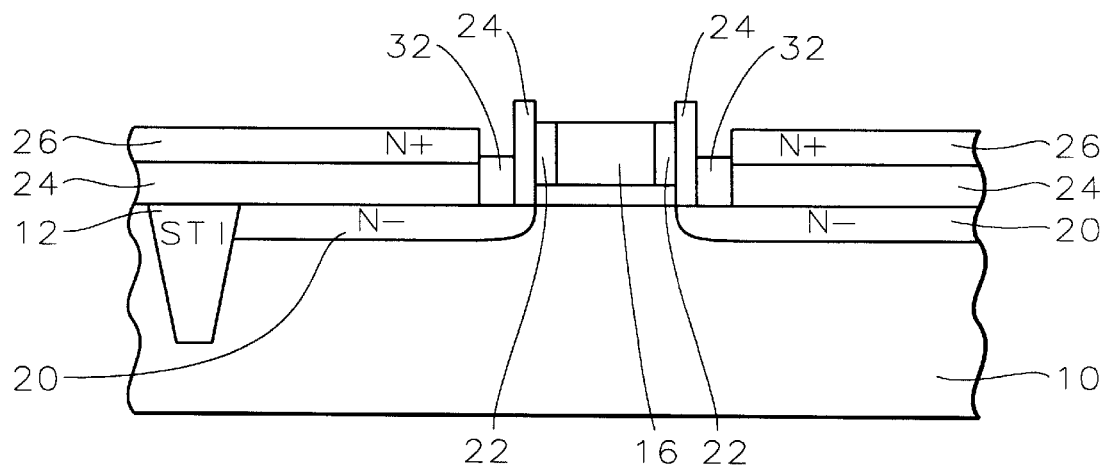

Now, the nitride layer 28 and the nitride cap 18 are removed by a wet chemical process, for example. This is shown in FIG. 9.

Figure 10:
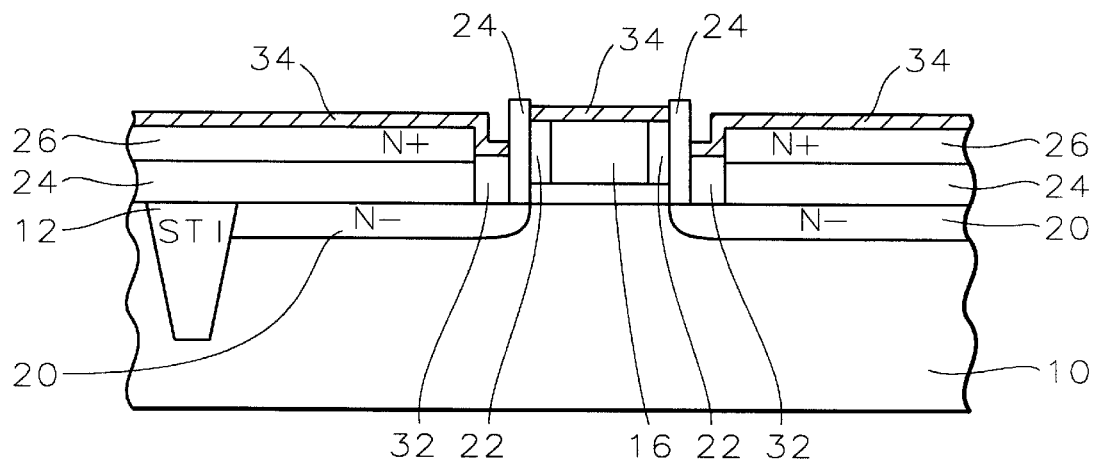

Referring now to FIG. 10, a metal layer 34 is sputter deposited over the surface of the substrate to a thickness of between about 100 and 200 Angstroms. The metal layer may comprise titanium, cobalt, titanium and cobalt, titanium nitride, titanium, and cobalt, nickel, nickel and platinum, and so on. The metal layer is silicided, such as by a rapid thermal annealing (RTA) at a temperature of between about 650 and 850° C. for 20 to 30 seconds. This annealing will form a metal silicide layer overlying the polysilicon gate electrode 16, the polysilicon layer 26 and the epi-silicon layer 32. The metal overlying the oxide liner layer 24 is unreacted and removed by a conventional process. FIG. 10 illustrates the silicided gate electrode 16 and source/drain regions 26.

The oxide layer 24 underlying the polysilicon layer 26 acts as a stress relief bed during silicidation. The oxide layer absorbs the compressive stress generated during silicidation and does not pass it on to the underlying silicon layer. Thus, defects are reduced and stress junctions are eliminated.

Figure 11:
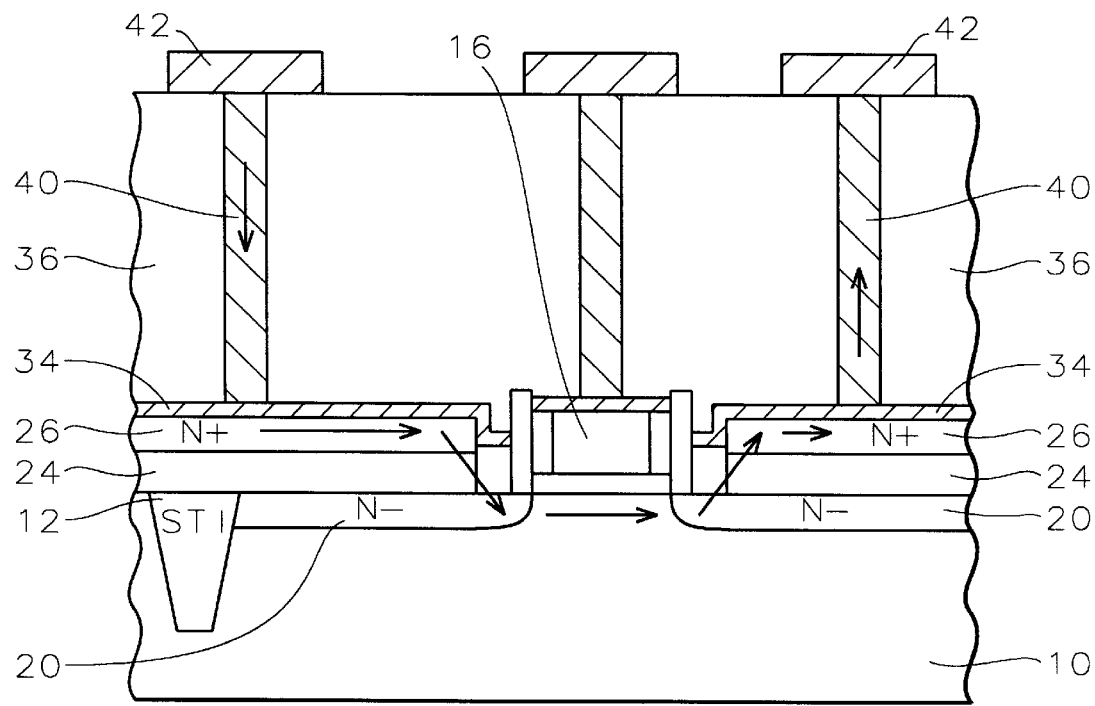
FIG. 11 schematically illustrates in cross-sectional representation a completed integrated circuit fabricated according to a preferred embodiment of the present invention.

Standard backend processing continues as is conventional to complete the integrated circuit. For example, FIG. 11 shows a completed integrated circuit device. A thick dielectric layer 36 covers the silicided gate 16 and source and drain regions 26. Electrical connections may be made, for example, through openings in the dielectric layer to the silicided gate 16 and source/drain regions 26 by metal contacts 40, as shown. The arrows show the current path from the source 42 through the source junction 26 to the source extension 20 and the channel underlying the gate 16 to the drain extension 20, the drain junction 26, and then to the drain 42.

The process of the invention provides an effective method for siliciding source/drain junctions whereby the bulk of compressive stress from the silicided junctions is relieved by an oxide buffer layer between the silicide and the silicon substrate. Relieving the compressive stress generated during silicidation reduces defects resulting in lower leakage current.

While the invention has been particularly shown and described with reference to the preferred embodiments thereof, it will be understood by those skilled in the art that various changes in form and details may be made without departing from the spirit and scope of the invention.

What is claimed is:

1. A method of siliciding source/drain junctions in the manufacture of an integrated circuit comprising:

providing a gate electrode on a semiconductor substrate and associated source/drain extensions within said semiconductor substrate;

depositing a buffer oxide layer overlying said semiconductor substrate and said gate electrode;

depositing a polysilicon layer overlying said buffer oxide layer wherein said polysilicon layer forms source/drain junctions overlying said source/drain extensions; and siliciding said source/drain junctions whereby said buffer oxide layer provides compressive stress relief during said siliciding to complete said siliciding of said source/drain junctions in the fabrication of said integrated circuit device.

2. The method according to claim 1 wherein said buffer oxide layer has a thickness of between about 500 and 800 Angstroms.

3. The method according to claim 1 wherein said polysilicon layer is deposited to a thickness of between about 600 and 800 Angstroms.

4. The method according to claim 1 before said step of depositing said buffer oxide layer further comprising:

thermally oxidizing said gate electrode and said semiconductor substrate whereby an oxide layer is formed overlying said source/drain extensions and whereby sidewalls of said gate electrode are oxidized resulting in a smaller said gate electrode.

5. The method according to claim 4 wherein said step of thermally oxidizing also activates said source/drain extensions.

6. The method according to claim 1 wherein said buffer oxide layer forms vertical spacers between said gate electrode and said source/drain junctions.

7. The method according to claim 1 further comprising:

etching away said polysilicon layer on vertical sidewalls of said gate electrode thereby exposing a portion of said buffer oxide layer overlying said source/drain extensions;

etching away said exposed portion of said buffer oxide layer overlying said source/drain extensions to expose a portion of said substrate; and growing an epitaxial silicon layer over said exposed portion of said substrate wherein said epitaxial silicon layer forms a bridge between said source/drain regions and said source/drain extensions.

8. The method according to claim 7 wherein said epitaxial silicon growth is prevented over said source/drain junctions by a nitride blocking layer and wherein said epitaxial growth is prevented at sidewalls of said gate electrode by said buffer oxide layer.

9. The method according to claim 1 wherein said step of siliciding said source/drain junctions comprises:

depositing a metal layer overlying said polysilicon layer; and annealing said substrate whereby said metal layer overlying said polysilicon layer is transformed to a metal silicide layer.

10. The method according to claim 9 wherein said metal layer comprises one or more of the group containing titanium, cobalt, nickel, and platinum.

11. A method of siliciding source/drain junctions in the manufacture of an integrated circuit comprising:

providing a polysilicon gate electrode on a semiconductor substrate and associated source/drain extensions within said semiconductor substrate wherein a first nitride layer overlies a top surface of said polysilicon gate electrode;

depositing a buffer oxide layer overlying said semiconductor substrate and said gate electrode;

depositing a polysilicon layer overlying said buffer oxide layer;

depositing a second nitride layer overlying said polysilicon layer;

polishing back said nitride layer until said buffer oxide layer overlying said gate electrode is exposed whereby a vertical portion of said polysilicon layer is exposed adjacent to said buffer oxide layer forming a vertical sidewall on said gate electrode;

etching away said exposed polysilicon layer thereby exposing a portion of said buffer oxide layer overlying said source/drain extension wherein remaining horizontal portions of said polysilicon layer overlying said source/drain extensions form source/drain junctions;

etching away said exposed buffer oxide layer overlying said semiconductor substrate and overlying said gate electrode thereby exposing a portion of said semiconductor substrate and exposing said first nitride layer of said gate electrode;

thereafter growing an epitaxial-silicon layer overlying said exposed semiconductor substrate;

thereafter removing said first and second nitride layers; and siliciding said gate electrode and said source/drain junctions whereby said buffer oxide layer provides compressive stress relief during said siliciding to complete said siliciding of said source/drain junctions in the fabrication of said integrated circuit device.

12. The method according to claim 11 wherein said buffer oxide layer has a thickness of between about 500 and 800 Angstroms.

13. The method according to claim 11 wherein said polysilicon layer is deposited to a thickness of between about 600 and 800 Angstroms.

14. The method according to claim 11 before said step of depositing said buffer oxide layer further comprising:

thermally oxidizing said gate electrode and said semiconductor substrate whereby an oxide layer is formed overlying said source/drain extensions and whereby sidewalls of said gate electrode are oxidized resulting in a smaller said gate electrode.

15. The method according to claim 14 wherein said step of thermally oxidizing also activates said source/drain extensions.

16. The method according to claim 11 wherein said polysilicon layer is doped.

17. The method according to claim 11 wherein said buffer oxide layer forms vertical spacers between said gate electrode and said source/drain junctions.

18. The method according to claim 11 wherein said step of etching away said exposed polysilicon layer is a self-aligned etch.

19. The method according to claim 11 wherein said step of etching away said exposed buffer oxide layer is a self-aligned etch.

20. The method according to claim 11 wherein said epitaxial silicon growth is prevented over said source/drain junctions by a nitride blocking layer and wherein said epitaxial growth is prevented at sidewalls of said gate electrode by said buffer oxide layer.

21. The method according to claim 11 wherein said step of siliciding said gate electrode and said source/drain junctions comprises:

depositing a metal layer overlying said substrate;

annealing said substrate whereby said metal layer overlying said polysilicon layer, said polysilicon gate electrode, and said epi-silicon layer is transformed to a metal silicide layer and wherein said metal layer overlying said buffer oxide layer on sidewalls of said polysilicon gate electrode is unreacted; and removing said unreacted metal layer to complete said siliciding of said gate electrode and said source/drain junctions.

22. The method according to claim 21 wherein said metal layer comprises one or more of the group containing titanium, cobalt, nickel, and platinum.

23. A method of siliciding source/drain junctions in the manufacture of an integrated circuit comprising:

providing a polysilicon gate electrode on a semiconductor substrate and associated source/drain extensions within said semiconductor substrate wherein a first nitride layer overlies a top surface of said polysilicon gate electrode;

thermally oxidizing said gate electrode and said semiconductor substrate whereby an oxide layer is formed overlying said source/drain extensions and whereby sidewalls of said gate electrode are oxidized resulting in a smaller said gate electrode;

depositing a buffer oxide layer overlying said oxide layer and said gate electrode;

depositing a doped polysilicon layer overlying said buffer oxide layer;

depositing a second nitride layer overlying said polysilicon layer;

polishing back said nitride layer until said buffer oxide layer overlying said gate electrode is exposed whereby a vertical portion of said polysilicon layer is exposed adjacent to said buffer oxide layer forming a vertical sidewall on said gate electrode;

etching away said exposed polysilicon layer thereby exposing a portion of said buffer oxide layer overlying said source/drain extensions wherein remaining horizontal portions of said polysilicon layer overlying said source/drain extensions form source/drain junctions;

etching away said exposed buffer oxide layer overlying said semiconductor substrate and overlying said gate electrode thereby exposing a portion of said semiconductor substrate and exposing said first nitride layer of said gate electrode;

thereafter growing an epitaxial-silicon layer overlying said exposed semiconductor substrate;

thereafter removing said first and second nitride layers;

thereafter depositing a metal layer overlying said substrate;

annealing said substrate whereby said metal layer overlying said polysilicon layer, said polysilicon gate electrode, and said epi-silicon layer is transformed to a metal silicide layer and wherein said metal layer overlying said buffer oxide layer on sidewalls of said polysilicon gate electrode is unreacted whereby said buffer oxide layer provides compressive stress relief during said annealing; and removing said unreacted metal layer to complete said siliciding of said source/drain junctions in the fabrication of said integrated circuit device.

24. The method according to claim 23 wherein said buffer oxide layer has a thickness of between about 500 and 800 Angstroms.

25. The method according to claim 23 wherein said polysilicon layer is deposited to a thickness of between about 600 and 800 Angstroms.

26. The method according to claim 23 wherein said step of thermally oxidizing also activates said source/drain extensions.

27. The method according to claim 23 wherein said buffer oxide layer forms vertical spacers between said gate electrode and said source/drain junctions.

28. The method according to claim 23 wherein said step of etching away said exposed polysilicon layer is a self-aligned etch.

29. The method according to claim 23 wherein said step of etching away said exposed buffer oxide layer is a self-aligned etch.

30. The method according to claim 23 wherein said epitaxial silicon growth is prevented over said source/drain junctions by a nitride blocking layer and wherein said epitaxial growth is prevented at sidewalls of said gate electrode by said buffer oxide layer.

31. The method according to claim 23 wherein said metal layer comprises one or more of the group containing titanium, cobalt, nickel, and platinum.

* * * * *

UNITED STATES PATENT AND TRADEMARK OFFICE
CERTIFICATE OF CORRECTION

PATENT NO. : 6,284,610 B1
DATED : September 4, 2001
INVENTOR(S) : Randall Cher Liang Cha, Chua Chee Tee, Pey Kin Leong, Lap Chan It is certified that error appears in the above-identified patent and that said Letters Patent is hereby corrected as shown below:

<u>Title page,</u>
Item [75], delete "Chee Tee Chua" and replace with -- Chua Chee Tee --, and delete "Kin Leong Pey" and replace with -- Pey Kin Leong --.

Signed and Sealed this

Second Day of April, 2002

Attest:

JAMES E. ROGAN
*Director of the United States Patent and Trademark Office*

*Attesting Officer*